United States Patent
Wu et al.

(10) Patent No.: US 6,569,606 B1
(45) Date of Patent: May 27, 2003

(54) METHOD OF REDUCING PHOTORESIST SHADOWING DURING ANGLED IMPLANTS

(75) Inventors: David Donggang Wu, Austin, TX (US); William R. Roche, Beaverton, OR (US); Massud Aminpur, Dresden (DE); Scott D. Luning, Austin, TX (US); Karen L. E. Turnqest, Pflugerville, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 330 days.

(21) Appl. No.: 09/626,666

(22) Filed: Jul. 27, 2000

(51) Int. Cl.[7] ................................................. G03C 5/00
(52) U.S. Cl. ...................... 430/322; 430/311; 430/396; 430/397; 359/709; 438/302
(58) Field of Search ................. 430/311–322, 396–397; 359/709; 438/302

(56) References Cited

U.S. PATENT DOCUMENTS

| | | | |
|---|---|---|---|
| 4,705,597 A | * 11/1987 | Gimpelson et al. | 156/643 |
| 5,140,469 A | * 8/1992 | Lamarre et al. | 359/709 |
| 5,409,538 A | * 4/1995 | Nakayama et al. | 118/688 |
| 5,636,004 A | 6/1997 | Ootaka et al. | 355/67 |
| 5,883,703 A | 3/1999 | Knirck et al. | 355/55 |
| 5,959,784 A | 9/1999 | Seki et al. | 359/663 |

OTHER PUBLICATIONS

Wolf and Tauber, Silicon Processing for the VLSI Era, vol. I: Process Technology, 2nd Ed., Lattice Press, pp. 545–582.

* cited by examiner

*Primary Examiner*—Mark F. Huff
*Assistant Examiner*—Daborah Chacko Davis
(74) *Attorney, Agent, or Firm*—Williams, Morgan & Amerson, P.C.

(57) ABSTRACT

The present invention is directed to a method of forming halo implants in a semiconductor device. In one illustrative embodiment, the method comprises forming a structure above a semiconducting substrate, forming a layer of photoresist above the structure and the substrate, and positioning the substrate in an exposure tool that has a light source and a focal plane. The method further comprises positioning the surface of the layer of photoresist in an exposure plane that is different from the focal plane of the exposure tool, exposing the photoresist to the light source of the exposure tool while the surface of the photoresist is in the exposure plane, and developing the layer of photoresist to define an opening in the layer of photoresist around the structure on the substrate.

14 Claims, 2 Drawing Sheets

METHOD OF REDUCING PHOTORESIST SHADOWING DURING ANGLED IMPLANTS

BACKGROUND OF THE INVENTION

1. Field of the Invention

The present invention is generally directed to the field of semiconductor processing, and, more particularly, to a method of forming halo implants in semiconductor devices.

2. Description of the Related Art

There is a constant drive within the semiconductor industry to increase overall performance and operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the transistor, the faster the transistor will operate. Thus, there is a constant drive to reduce the size, or scale, of the components of a typical transistor to increase device performance and the overall speed of the transistor, as well as integrated circuit devices incorporating such transistors.

Moreover, there is a constant drive to increase the density of modern integrated circuit devices, i.e., to put more and more semiconductor devices, e.g., transistors, closer and closer together on a single chip. Increasing the density of integrated circuit devices makes more efficient use of the substrate plot space, and may assist in increasing the overall yield from semiconductor manufacturing operations.

One problem encountered in efforts to increase the density of modem integrated circuit devices arises from limitations of the processes used to form halo implants in semiconductor devices. By way of background, halo implants are typically formed by implanting dopant atoms into the substrate at an angle with respect to the surface of the substrate so as to result in a doped region that extends slightly under the gate dielectric of a typical field effect transistor. The dopant atoms used to form the halo implants will typically be comprised of the same type of dopant (N-type or P-type) as used to dope the underlying substrate. For example, in the case of forming NMOS devices, the halo implant will be comprised of a P-type dopant, e.g., boron. The purpose of the halo implant is to reduce the so-called short channel effects that are a result of device sizes being continually reduced. In particular, the halo implants are made in an effort to control or reduce the variations in the threshold voltage of an integrated circuit device due to variations in the channel length of the device. Despite a great effort, variations in the channel length of semiconductor devices are not uncommon. These variations occur due to a variety of reasons, e.g., manufacturing tolerances, implant variations, etc.

Many modem integrated circuit devices are comprised of both NMOS-type devices and PMOS-type devices, or a combination of both, e.g., CMOS technology. During the formation of these various halo implants, one of the types of devices, e.g., PMOS devices, must be covered or masked with a layer of material, such as photoresist, such that the dopant atoms are implanted only into the appropriate devices, i.e., the layer of photoresist keeps the dopant atoms from being implanted into unwanted areas. However, since the halo implants are typically performed at an angle, e.g., 45 degrees, the height of the layer of photoresist limits how close the devices of different construction, e.g., NMOS and PMOS devices, may be placed together. This, in turn, causes an undesirable consumption of plot space on an integrated circuit device.

FIGS. 1 and 2 illustrate the problem encountered in forming halo implants using photoresist masks on densely packed integrated circuit devices. FIG. 1 depicts a partially-formed semiconductor device 11. The device 11 is comprised of a gate dielectric 19 formed above a surface 15 of a semiconducting substrate 13, and a gate electrode 17 formed above the gate dielectric 19. A layer of photoresist 21 is formed above the gate electrode 17 and the substrate 13.

Next, as shown in FIG. 2, an opening 23 is formed in the layer of photoresist 21 using traditional photolithographic techniques. The opening 23 has relatively vertical sidewalls and relatively sharp corners 27. The problem may arise when an angled implant process, such as that indicated by arrows 29, is performed in order to introduce dopant ions into the substrate 13 under the gate dielectric 19. That is, given the relative height of the layer of photoresist, and the spacing between the sidewalls 25 of the opening 23 and the sides 31 of the electrode 17, the corner area 33 of the layer of photoresist 21 may act to prevent the ions from being implanted into the desired area, see, e.g., dashed lines 22. This is known as shadowing. Prior techniques for combating this problem included spacing devices far enough apart such that the patterned layer of photoresist 21 does not block the dopant ions from the intended target.

Moreover, the height of the photoresist mask cannot be readily reduced as existing photolithography equipment has a minimum formed thickness requirement of approximately 5000 Å. Of course, it is anticipated that efforts are being made, or will be made, to reduce the minimum thickness to which layers of photoresist may be formed. However, irrespective of the thickness of the layer of photoresist 21, it is desirable to reduce the shadowing effect by the layer of photoresist during angled implantation processes, thereby allowing devices to be spaced more closely together on an integrated circuit device. This, in turn, will increase density and product yields in semiconductor device manufacturing.

The present invention is directed to a method that solves or at least reduces some or all of the aforementioned problems.

SUMMARY OF THE INVENTION

The present invention is directed to a method of forming halo implants in a semiconductor device. In one illustrative embodiment, the method comprises forming a structure above a semiconducting substrate, forming a layer of photoresist above the structure and the substrate, and positioning the substrate in an exposure tool that has a light source and a focal plane. The method further comprises positioning the surface of the layer of photoresist in an exposure plane that is different from the focal plane of the exposure tool, exposing the photoresist to the light source of the exposure tool while the surface of the photoresist is in the exposure plane, and developing the layer of photoresist to define an opening in the layer of photoresist around the structure on the substrate.

BRIEF DESCRIPTION OF THE DRAWINGS

The invention may be understood by reference to the following description taken in conjunction with the accompanying drawings, in which like reference numerals identify like elements, and in which.

Figure 1:
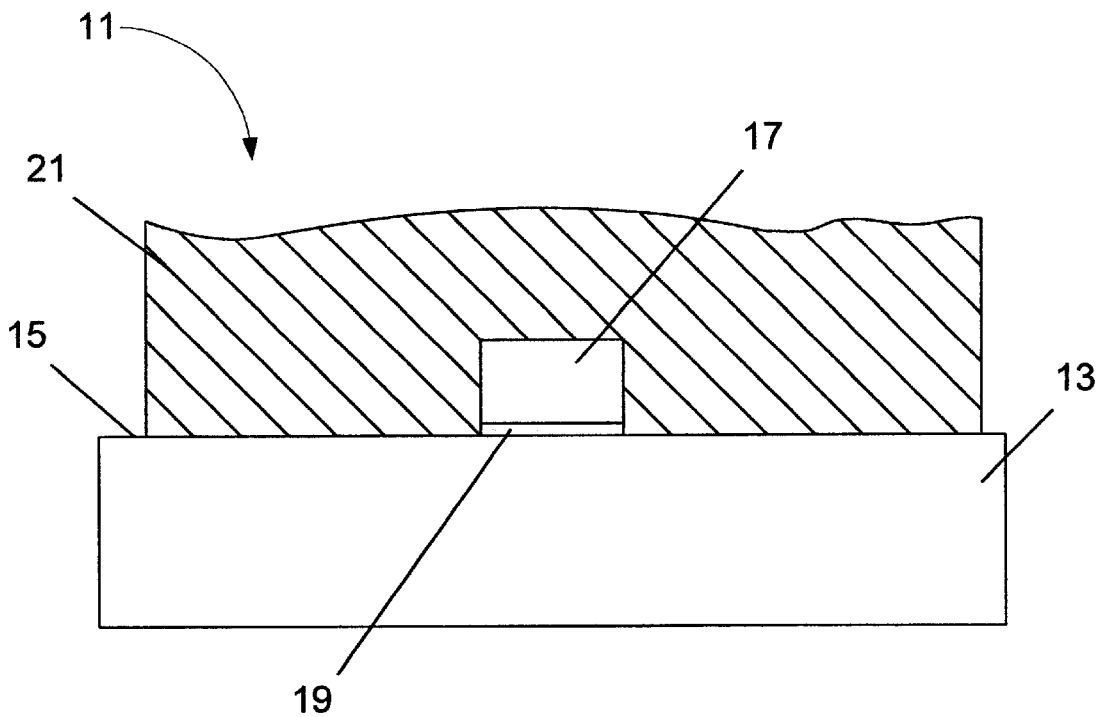
FIG. 1 is a cross-sectional view of an illustrative, partially-formed semiconductor device with a layer of photoresist formed thereabove.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 3–4. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of reducing photoresist shadowing in angled implant processes performed on semiconductor devices. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

Figure 3:
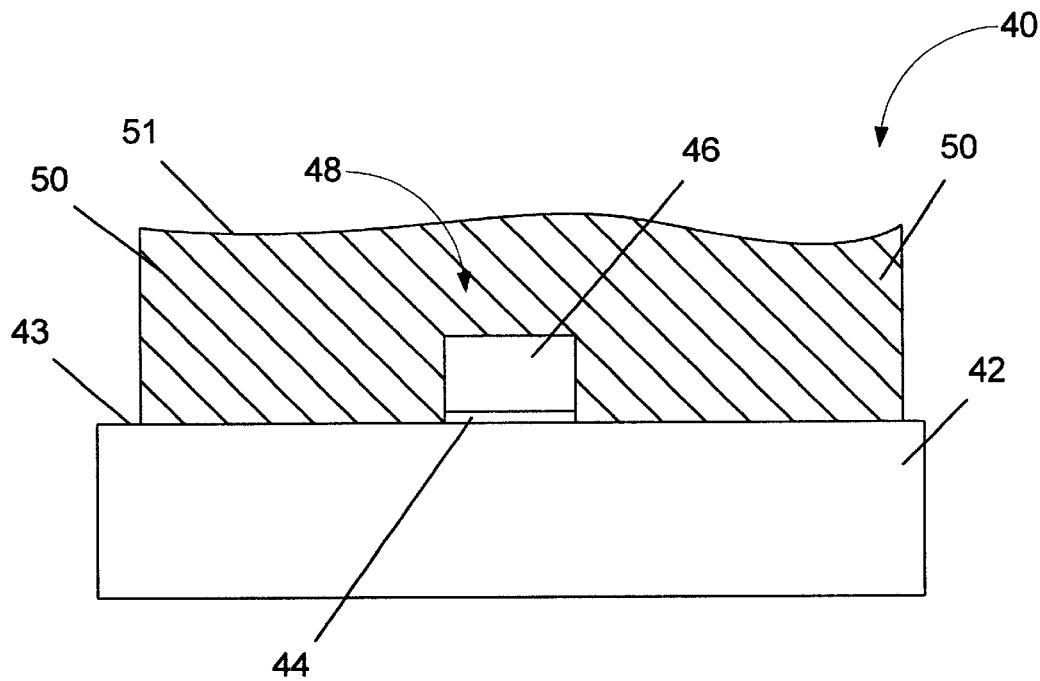
FIG. 3 is a cross-sectional view of a partially-formed semiconductor device that depicts an initial step of forming a layer of photoresist above the device in accordance with one illustrative embodiment of the present invention.

A partially-formed semiconductor device 40 is depicted in FIG. 3. The device 40 is comprised of a gate dielectric 44 formed above a surface 43 of a semiconducting substrate 42, and a gate electrode 46 formed above the gate dielectric 44. Taken collectively, the gate electrode 46 and the gate dielectric 44 may be considered a gate stack 48. The semiconducting substrate 42 may be comprised of a variety of materials, such as silicon with a layer of epitaxial silicon (not shown) formed thereabove, e.g., a P-type layer of epitaxial silicon formed over a P-doped bulk silicon substrate.

The materials comprising the gate dielectric layer 44 and the gate electrode layer 46 may be varied as a matter of design choice. For example, the gate dielectric layer 44 may be comprised of silicon dioxide or a nitrogen bearing oxide, and the gate electrode layer 46 may be comprised of polycrystalline silicon (polysilicon). Dopant atoms may also be added to the gate electrode by, for example, an ion implantation process, to reduce the sheet resistance of the gate electrode. Moreover, these layers may be formed by a variety of known techniques for forming such layers, such as thermal growth, chemical vapor deposition ("CVD"), physical vapor deposition ("PVD"), plasma enhanced chemical vapor deposition ("PECVD"), sputtering, etc. Thus, the particular materials of construction as well as the manner of making the gate dielectric layer 44 and the gate electrode layer 46 should not be considered a limitation of the present invention unless specifically recited in the appended claims. In one illustrative embodiment, the gate dielectric layer 44 is comprised of a thermally grown layer of silicon dioxide having a thickness ranging from approximately 15–30 Å, and the gate electrode layer 46 is comprised of approximately 1000–3000 Å of polysilicon that is formed by a deposition process.

Thereafter, as shown in FIG. 3, a layer of photoresist 50 is formed above the substrate 48 and the substrate 42. The layer of photoresist 50 may be formed using traditional photolithography equipment and standard techniques. The thickness of the layer of photoresist 50 may be varied as a matter of design choice. In one illustrative embodiment, the layer of photoresist 50 may be formed so as to have a thickness of approximately 5000 Å, and it may be formed by a spin-coating process. The surface 51 of the layer of photoresist 50 may be wavy and irregular due to the inherent nature of the photoresist and the processes used to form the layer, as well as the presence of underlying structures on the substrate 42, such as the gate stack 48 depicted in FIG. 3.

Figure 4:
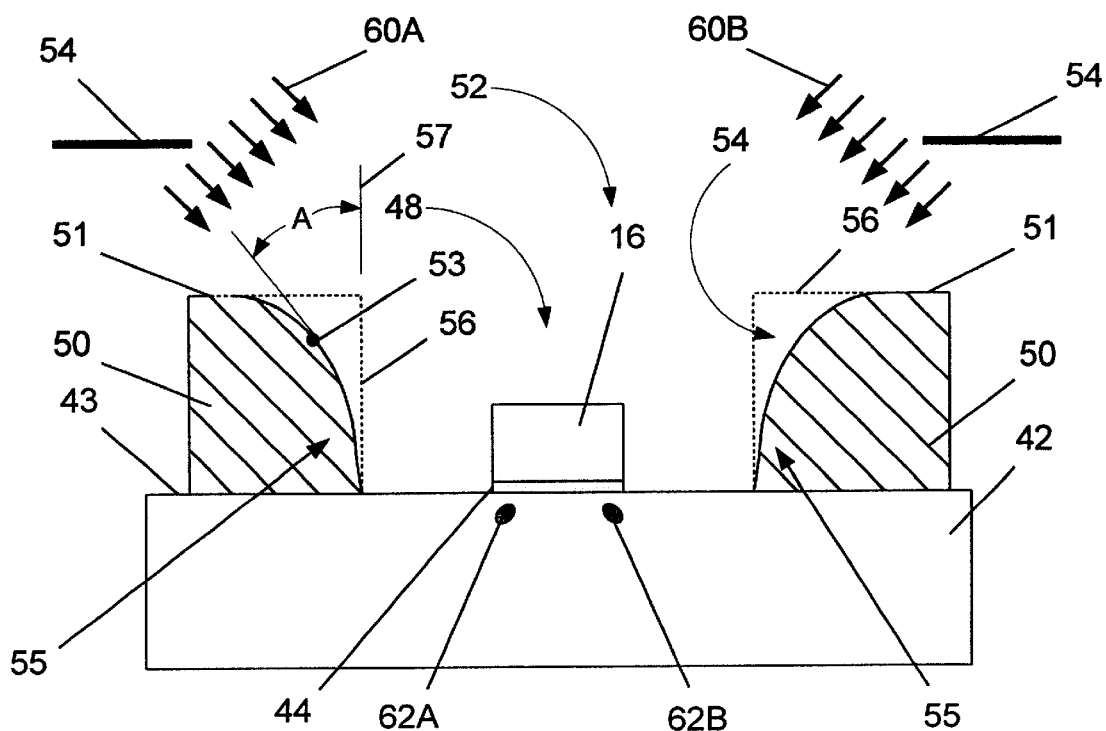
FIG. 4 depicts the device shown in FIG. 3 after an opening has been defined in the layer of photoresist using one illustrative embodiment of the present invention.

Next, as shown in FIG. 4, the layer of photoresist 50 is patterned to define an opening 52. The opening 52 may be formed with non-square-edged, rounded corners 54 using the novel techniques disclosed herein. The non-square-edged corners 54 are to be contrasted with the relatively sharp corner configuration of openings formed in photoresist layers using known photolithographic techniques, as indicated by the dashed lines 56. Compare the configuration of the opening 28 (see FIG. 2) with that of the opening 52 shown in FIG. 4. Note that the opening 23 has relatively vertical sidewalls 25 with approximately square-edged corners 27; whereas, at least portions of the sidewalls 55 of the opening 52 have a non-square-edged or rounded configuration. The shape and magnitude of the rounding of the corners 54 may be varied as a matter of design choice. In one illustrative embodiment, the approximate apex 53 of the non-square-edged corners 54 may be positioned at an angle "A" ranging from approximately 10–30 degrees with respect to a vertical line 57.

When compared to prior art techniques, the opening 52 in the layer of photoresist 50 with the non-square-edged corners 54 allows more access to the target of the implantation process, e.g., the substrate 42. That is, forming openings 52 in the layer of photoresist 50 using the techniques disclosed herein results in less shadowing by the layer of photoresist 50. The net result is that devices may be more densely packed since the shadowing effects are reduced.

The configuration of the sidewalls 55, with non-square-edged corners 54, e.g., rounded corners, in the layer of photoresist 50 may be achieved by modifying the photolithography process used to define the opening 52 in the layer of photoresist 50. The non-square-edged configuration of the sidewalls 55 in the layer of photoresist 50 may be formed by purposefully defocusing the exposure tool during the process of forming the opening 52. That is, the substrate 42 may be positioned in an exposure tool (not shown) such that the surface 51 of the layer of photoresist 50 may be exposed to the light source of the exposure tool when the surface 51 of the photoresist is intentionally positioned at a location, i.e., an exposure plane or second plane, that is different than the focal plane, as indicated by lines 54, of the optical projection system of the exposure tool. Of course, the plane at which the surface 51 of the layer of photoresist 50 will be positioned should be understood to be deep enough to encompass at least some of the surface irregularities of the surface 51 of the layer of photoresist 50.

The defocusing may be accomplished by positioning the surface 51 of the layer of photoresist at the focal plane 54 of the exposure tool and, thereafter, moving the substrate 42, and the surface 51 of the layer of photoresist 50, the desired distance away from the focal plane 54 of the exposure tool. Alternatively, the surface 51 may be directly positioned at the desired out-of-focus location.

In addition, the non-square edged corners 54 may be formed by increasing the exposure energy used during the photolithography process. For example, depending upon the number of lines and the line spacing, the exposure energy may be increased by approximately 5–10% as compared to the optimal exposure energy level, i.e., an energy level whereby there is an approximately 1:1 image transfer to the layer of photoresist. This may be accomplished by a variety of techniques depending upon a variety of factors, such as the type of device under construction, the type of tools involved in the photolithography process, etc. For example, the exposure energy may be increased by decreasing scanning speed, increasing exposure time, increasing the energy level of the light source, etc. In sum, a technique whereby the energy per unit area applied to the wafer, e.g., millijoules/cm$^2$, is increased may be used with the present invention to achieve the results described herein.

In the illustrative embodiment of the present invention depicted in FIG. 3, the surface 51 of the layer of photoresist 50 is positioned below the focal plane 54 of the exposure tool. By placing the surface 51 of the layer of photoresist 50 below the focal plane 54 of the exposure tool, the light rays from the exposure tool are diffracted or more spread out when they contact the surface 51 of the layer of photoresist 50. The present invention may be used with a variety of different types of exposure tools, such as an in-line tool, a DUV tool, etc. Moreover, the present invention may be used as so-called deep ultraviolet exposure tools are used to produce finer and finer images in the layer of photoresist 50.

Figure 2:
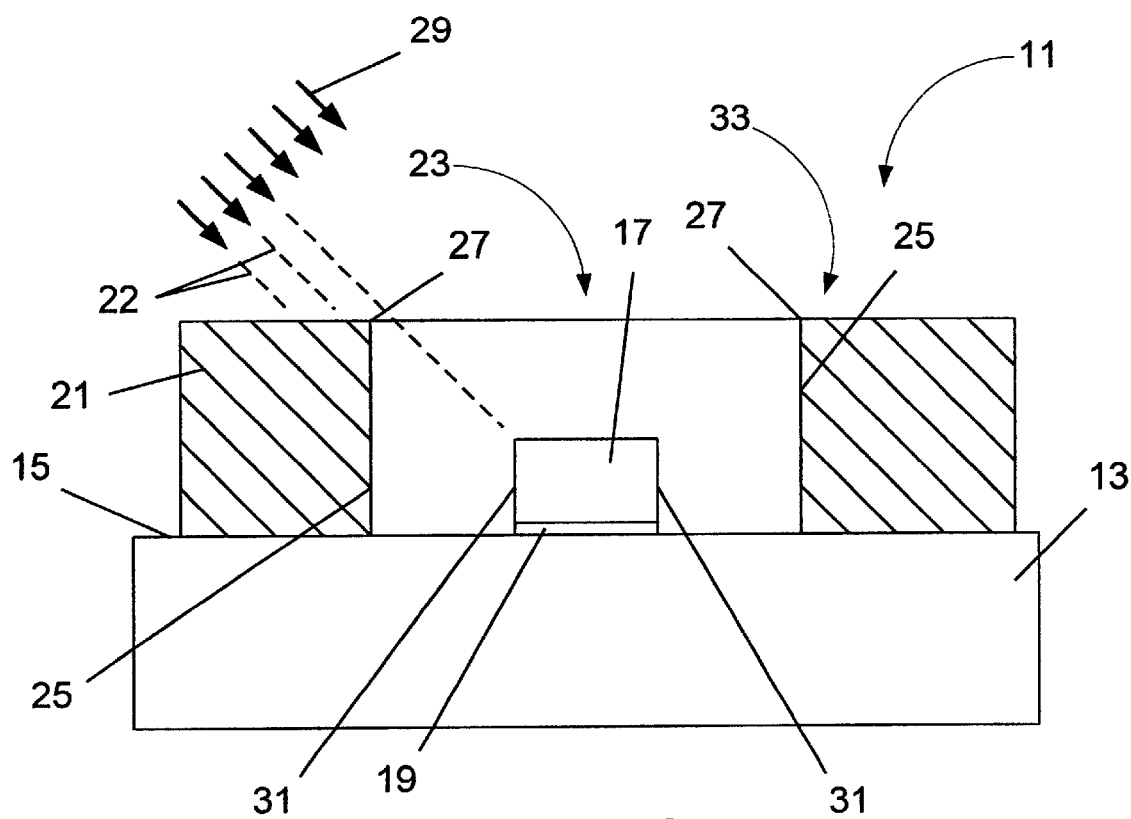
FIG. 2 is a cross-sectional view of the device shown in FIG. 1 after an opening has been formed in the layer of photoresist, and an illustrative implantation process is being performed on the device.

Using this technique, the exposure tool is purposefully defocused from the setting that would produce the approximately square-edged corners 27, depicted in FIG. 2, to a setting that would produce non-square-edged corners, e.g., rounded corners 54, depicted in FIG. 4. The amount by which the exposure tool will be defocused depends on the amount of distortion desired in forming the sidewalls 55 in the opening 52 (see FIG. 4) as compared to the sidewalls 25 and corners 27 of the opening 23 (see FIG. 2) using prior art techniques. That is, the process will need to be optimized to determine the resulting profile achieved in the layer of photoresist 50 when the opening 52 is defined therein. Many other process variables may also affect the resulting profile of the sidewall 55. For example, the thickness of the layer of photoresist 50, the type of stepper equipment employed, the type of photoresist used, and the strength and wavelength of the light source used by the exposure tool, etc., all may impact the configuration of the resulting sidewall 55. Nevertheless, through use of the present invention, openings formed in layers of photoresist may be effectively widened by defocusing the exposure tool, e.g., stepper, used in photolithographic processes. In turn, this reduces photoresist shadowing during halo implant processes, and allows the semiconductor devices to be more densely packed.

Thereafter, as indicated by arrows 60A, a halo implantation process is performed to form the halo implant 62A (schematically indicated in FIG. 4), at least a portion of which extends under a portion of the gate electrode 46. The device 40 may then be rotated, and a halo implant process 60B may then be performed to form halo implant 62B.

The halo implants 62A, 62B may be formed using a variety of process. Techniques and, thus, the particular technique employed to form the halo implants should not be considered a limitation of the present invention unless specifically set forth in the appended claims. For example, the semiconducting substrate 42 may be tilted downward in an ion implantation tool (not shown) at the appropriate angle, and the dopant atoms may be introduced by injecting the ions in a vertically downward direction. Alternatively, the semiconducting substrate 42 may be positioned in horizontal position in the implantation tool, and the dopant atoms could be directed downward toward the substrate at the appropriate angle, as indicated in FIG. 4. Of course, there may be other techniques used to introduce the dopant atoms into the substrate at an angle so as to implant some of the desired dopant atoms, e.g., halo implant 62A, under a portion of the gate stack 48.

Additionally the concentration of dopant atoms, as well as the energy level of the halo implant process, may be varied as a matter of design choice, and, thus, the particular parameters of the ion implantation process should not be considered a limitation of the present invention, unless specifically set forth in the appended claims. For example, the halo implants 62A, 62B may be formed by performing an ion implantation process at a concentration ranging from approximately $1 \times 10^{12}$–$1 \times 10^{14}$ ions/cm$^2$ of the appropriate dopant atoms, e.g., boron for NMOS devices, arsenic or phosphorous for PMOS devices.

Through use of the techniques disclosed herein, devices on an integrated circuit device may be spaced more closely together, yet still allowing sufficient space in which to form the halo implants on certain devices while masking other adjacent devices. This, in turn, increases the device density on the integrated device and improves device yields.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a photoresist mask for angled implant processes, comprising:

forming a structure above a semiconducting substrate;

forming a layer of photoresist above said structure and said substrate, said layer of photoresist having a surface;

positioning said substrate in a photolithography tool, said tool having a light source and a focal plane;

intentionally positioning said surface of said layer of photoresist in an exposure plane that is different from said focal plane of said tool;

exposing at least a portion of said layer of photoresist to said light source while said surface of said layer of photoresist is in said exposure plane;

developing said layer of photoresist to define an opening in the layer of photoresist around said structure; and performing an angled implant process through said opening in said layer of photoresist using at least one of an N-type and P-type dopant material.

2. The method of claim 1, further comprising exposing said layer of photoresist to an exposure energy that ranges from approximately 105–110% of an optimal exposure energy for said layer of photoresist.

3. The method of claim 1, wherein forming a structure above a semiconducting substrate comprises forming a gate electrode above a semiconducting substrate.

4. The method of claim 1, wherein forming a layer of photoresist above said structure and said substrate, said layer of photoresist having a surface, comprises spin-coating a layer of photoresist above said structure and said substrate, said layer of photoresist having a surface.

5. The method of claim 1, wherein developing said layer of photoresist to define an opening in the layer of photoresist around said structure comprises developing said layer of photoresist to define an opening having a non-square-edged profile in the layer of photoresist around said structure.

6. The method of claim 1, wherein developing said layer of photoresist to define an opening in the layer of photoresist around said structure comprises developing said layer of photoresist to define an opening having rounded corners in the layer of photoresist around said structure.

7. The method of claim 1, wherein developing said layer of photoresist to define an opening in the layer of photoresist around said structure comprises developing said layer of photoresist to define an opening in the layer of photoresist around said structure , said opening having rounded corners defined by an apex, said apex being positioned at an angle ranging from approximately 10–30 degrees with respect to a line normal to said structure.

8. The method of claim 1, wherein performing an angled implant process through said opening in said layer of photoresist comprises performing an angled implant process through said opening in said layer of photoresist using a dopant material that is of a same type as a dopant material used in doping said substrate.

9. The method of claim 1, wherein intentionally positioning said surface of said layer of photoresist in an exposure plane that is different from said focal plane of said tool comprises intentionally positioning said surface of said layer of photoresist in an exposure plane that is below said focal plane of said tool.

10. A method of forming a photoresist mask for angled implant processes, comprising:

forming a structure comprised of a gate electrode above a semiconducting substrate;

spin-coating a layer of photoresist above said structure and said substrate, said layer of photoresist having a surface;

positioning said substrate in an exposure tool, said tool having a light source and a focal plane;

intentionally positioning said surface of said layer of photoresist in an exposure plane that is different from said focal plane of said tool;

exposing at least a portion of said layer of photoresist to said light source while said surface of said layer of photoresist is in said exposure plane;

intentionally exposing said layer of photoresist to an exposure energy that ranges from approximately 105–110% of an optimal exposure energy for said layer of photoresist;

developing said layer of photoresist to define an opening in the layer of photoresist around said structure; and performing an angled implant process through said opening in said layer of photoresist using at least one of an N-type and P-type dopant material.

11. The method of claim 10, wherein developing said layer of photoresist to define an opening in the layer of photoresist around said structure comprises developing said layer of photoresist to define an opening having a non-square-edged profile in the layer of photoresist around said structure.

12. The method of claim 10, wherein developing said layer of photoresist to define an opening in the layer of photoresist around said structure comprises developing said layer of photoresist to define an opening having rounded comers in the layer of photoresist around said structure.

13. The method of claim 10, wherein developing said layer of photoresist to define an opening in the layer of photoresist around said structure comprises developing said layer of photoresist to define an opening in the layer of photoresist around said structure, said opening having rounded comers defined by an apex, said apex being positioned at an angle ranging from approximately 10–30 degrees with respect to a line normal to said structure.

14. The method of claim 10, wherein performing an angled implant process through said opening in said layer of photoresist comprises performing an angled implant process through said opening in said layer of photoresist using a dopant material that is of a same type as a dopant material used in doping said substrate.

* * * * *